(12) United States Patent
Sano et al.

(10) Patent No.: US 6,448,743 B2
(45) Date of Patent: Sep. 10, 2002

(54) RECHARGEABLE BATTERY PACK

(75) Inventors: Yoshinao Sano; Nobuo Shiojima, both of Tokyo; Kiyoshi Ishitsuka, Kanagawa, all of (JP)

(73) Assignee: Toshiba Battery Co., Ltd., Tokyo (JP)

( * ) Notice: Subject to any disclaimer, the term of this patent is extended or adjusted under 35 U.S.C. 154(b) by 0 days.

(21) Appl. No.: 09/892,443

(22) Filed: Jun. 28, 2001

(30) Foreign Application Priority Data

Jun. 29, 2000 (JP) ........................................ 2000-196566

(51) Int. Cl.$^7$ ................................................ H02J 7/16
(52) U.S. Cl. ..................................................... 320/162
(58) Field of Search ......................... 320/162; 324/429, 324/430–435; 340/636; 702/63

(56) References Cited

U.S. PATENT DOCUMENTS

| 4,888,716 A | * 12/1989 | Ueno ........................... 324/429 |
| 5,936,383 A | 8/1999 | Ng et al. ........................ 702/63 |

FOREIGN PATENT DOCUMENTS

| DE | 195 33 445 | 3/1997 |
| JP | 11-329512 | 11/1999 |
| JP | 2000-012104 | 1/2000 |

OTHER PUBLICATIONS

Patent Abstract of Japan, JP 11–218567, Aug. 10, 1999.

* cited by examiner

*Primary Examiner*—Edward H. Tso
*Assistant Examiner*—Pia Tibbits
(74) *Attorney, Agent, or Firm*—Oblon, Spivak, McClelland, Maier & Neustadt, P.C.

(57) ABSTRACT

A rechargeable battery pack has a battery voltage detector, a full charge detecting circuit detecting a full charge state, a switch interposed in a charge current circuit that opens the charge current circuit when detecting a fall charge state, a memory for storing a closed circuit voltage immediately before the charge current circuit is opened, an internal resistance detection circuit for finding a value corresponding to an internal resistance of the rechargeable battery cell from an open circuit voltage and the closed circuit voltage stored in the memory after the charge current circuit is opened, and a lifetime indicator to predict lifetime. This enables accurate determination of the lifetime of the rechargeable battery cell under stable conditions without wastefully consuming the charging capacity.

10 Claims, 5 Drawing Sheets

RECHARGEABLE BATTERY PACK

BACKGROUND OF THE INVENTION

1. Field of the Invention

The present invention relates to a rechargeable battery pack provided with a function enabling accurate judgement of the lifetime of a nickel-metal halide type battery (Ni-MH type battery) or other rechargeable battery cell.

2. Description of the Related Art

In recent years, extensive use has been made of rechargeable battery cells as sources of power for various types of electronic devices. Rechargeable battery cells however deteriorate in performance due to repeated charging and discharging or along with the elapse of time. Therefore, when using a rechargeable battery cell as a backup power supply to deal with service interruptions of commercial power such as seen in the uninterruptible power supplies for servers in network systems, it is important to obtain an accurate grasp of the battery performance and in turn the battery lifetime.

In the past, as a means for evaluating the performance of rechargeable battery cells (degree of cycle deterioration), for example, Japanese Unexamined Patent Publication (Kokai) No. 11-329512 discloses to measure the charge time required for reaching a full charge state when charging a rechargeable battery cell by a constant current and compare it with the charge time at the time of new product so as to determine the degree of deterioration of performance. It is difficult however to ensure uniform charging conditions of rechargeable battery cells at all times. Further, the charge time required for charging a rechargeable battery cell to the full charge state differs according to the temperature of the battery cell.

As opposed to this, Japanese Unexamined Patent Publication (Kokai) No. 2000-12104 discloses a method of finding the residual battery capacity by determining the battery life from the internal resistance, battery voltage, and battery temperature of a rechargeable battery cell measured using a constant current load. To measure battery information (internal resistance) using a constant current load, however, a constant current load constituting an extra load on the rechargeable battery cell becomes necessary and therefore the configuration becomes bulkier and more expensive. Further, at the time of measurement, the current (charge current) of the rechargeable battery cell is wastefully consumed.

SUMMARY OF THE INVENTION

An object of the present invention is to provide a rechargeable battery pack of a simple configuration enabling accurate judgement of the lifetime of the rechargeable battery cell under stable conditions without wasteful consumption of the charge capacity of the rechargeable battery cell, that is, without discharge of the rechargeable battery cell.

The present invention takes note of the facts that the closed circuit voltage Von when charging a rechargeable battery cell and the open circuit voltage Voff of a rechargeable battery cell when opening the charge current circuit differ and that the voltage difference between them is closely related to the internal resistance of the rechargeable battery cell.

Therefore, the rechargeable battery pack according to the present invention is provided with a rechargeable battery cell comprised of for example a nickel-metal halide type battery, a battery voltage detecting means for detecting a terminal voltage of the rechargeable battery cell, a full charge detecting means for detecting a full charge state when charging the rechargeable battery cell, a switch device interposed in a charge current circuit of the rechargeable battery cell and turned off to open the charge current circuit when the full charge detecting means detects a full charge state, a memory for storing a closed circuit voltage Von of the rechargeable battery cell detected by the battery voltage detecting means immediately before the charge current circuit is opened, an internal resistance detecting means for finding a value corresponding to an internal resistance of the rechargeable battery cell from an open circuit voltage Voff of the rechargeable battery cell detected by the battery voltage detecting means and the closed circuit voltage Von stored in the memory after the charge current circuit is opened, and a lifetime indicating means for predicting the lifetime of the rechargeable battery cell in accordance with a value corresponding to the internal resistance of the rechargeable battery cell and outputting information L on the lifetime.

That is, the rechargeable battery pack according to the present invention detects the full charge state of the rechargeable battery cell when charging the rechargeable battery cell and measures the closed circuit voltage Von immediately before stopping the charging and the open circuit voltage Voff after stopping the charging to ensure uniform measurement conditions (battery state) and finds the value Rin corresponding to the internal resistance of the rechargeable battery cell as $$Rin=A(Von-Voff)$$

from the closed circuit voltage Von immediately before stopping the charging and the open circuit voltage Voff after stopping the charging to accurately judge the lifetime L of the rechargeable battery cell.

The rechargeable battery pack according to the present invention may further be provided with a current detecting means for detecting a charge current with respect to the rechargeable battery cell, store in the memory a closed circuit voltage Von of the rechargeable battery cell detected by the battery voltage detecting means and a battery charge current Ion detected by the current detecting means immediately before the charge current circuit is opened, and find a value corresponding to an internal resistance of the rechargeable battery cell as $$Rin=B(Von-Voff)/(Ion-Ioff)$$

from an open circuit voltage Voff of the rechargeable battery cell detected by the battery voltage detecting means and a current Ioff detected by the current detecting means after the charge current circuit is opened and the closed circuit voltage Von and battery charge current Ion stored in the memory.

At this time, it is preferable for the internal resistance detecting means to use a timer circuit to measure a time elapsed from the time of detecting the full charge state of the rechargeable battery cell and find an open circuit voltage Voff of the rechargeable battery cell or its current Ioff when a predetermined time elapses from the time of detecting the full charge state. Further, it is preferable to provide a means for prohibiting processing for calculating the internal resistance o of the rechargeable battery cell by the internal resistance detecting means when a discharge current of the rechargeable battery cell is detected by the current detecting means so as to prevent erroneous judgement of the battery life.

Further, preferably the rechargeable battery pack is further provided with a battery temperature detecting means for detecting a temperature T of the rechargeable battery cell and a correcting means for correcting the value corresponding to the internal resistance of the rechargeable battery cell found by the internal resistance detecting means in accordance with the detected battery temperature and the battery lifetime is judged by anticipating changes in the battery characteristics due to the battery temperature. Further, it is possible to operate the switch device to repeatedly close and open a charge current circuit for the rechargeable battery cell and detect the states of the rechargeable battery cell immediately before the charge current circuit is opened and after the charge current circuit is opened to eliminate variations in the measurement data at the time of detection of the status and evaluate the lifetime of the rechargeable battery cell with a high accuracy.

In addition, various techniques proposed in the past can be suitably employed for the full state detecting means. Various modifications can be made within the scope of the invention.

BRIEF DESCRIPTION OF THE DRAWINGS

These and other objects and features of the present invention will be more apparent from the following description given with reference to the accompanying drawings, wherein.

DESCRIPTION OF THE PREFERRED EMBODIMENTS

Below, an embodiment of the present invention will be explained with reference to the drawings taking as an example a rechargeable battery pack able to be used as a backup power source of a server in a network system.

Figure 1:
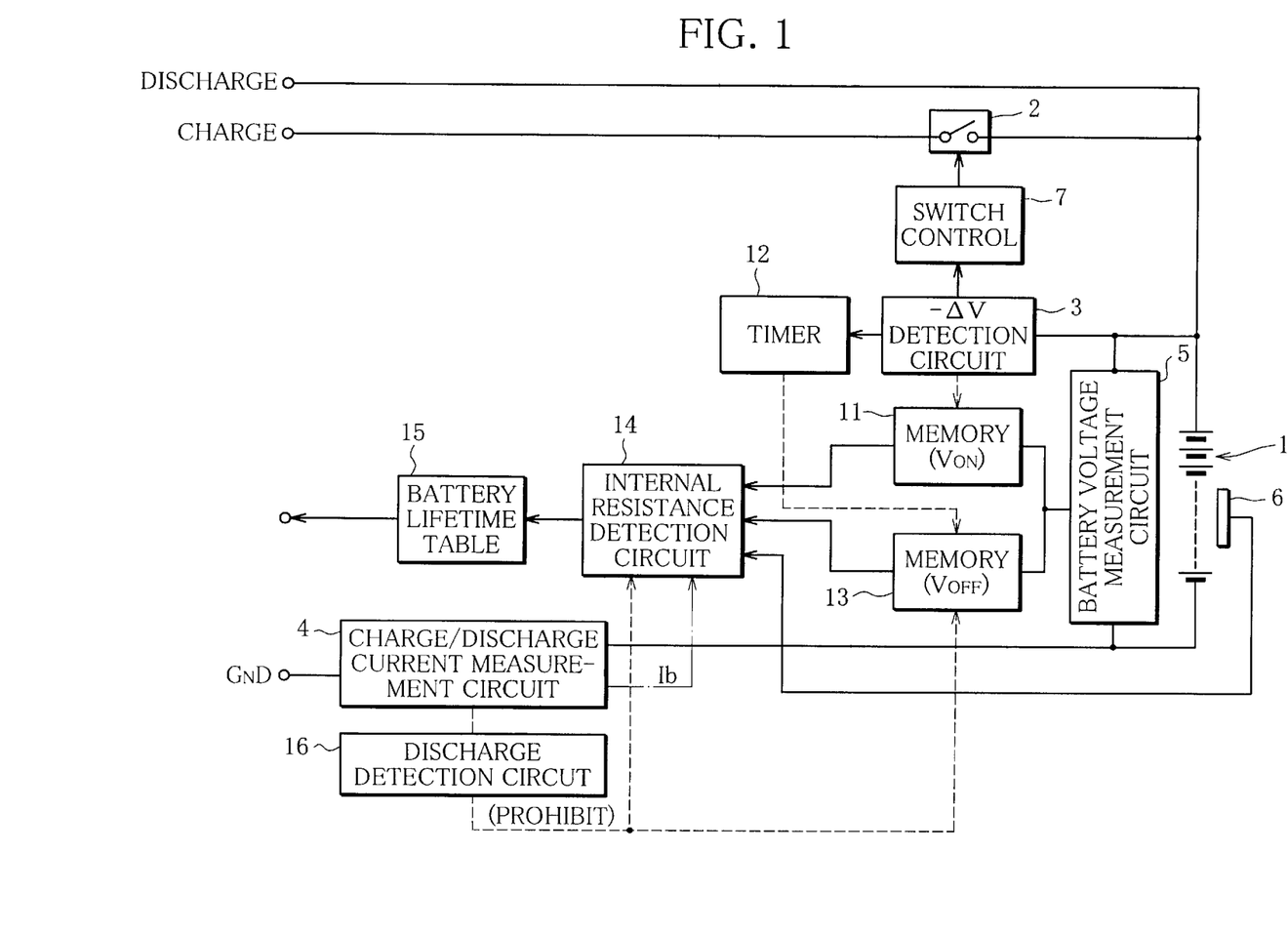
FIG. 1 is a view of the general configuration of a rechargeable battery pack according to a first embodiment of the present invention.

FIG. 1 is a view of the general configuration of a rechargeable battery pack according to this embodiment. Reference numeral 1 indicates an rechargeable battery cell comprised of a nickel-metal halide battery etc. The rechargeable battery cell 1 is comprised of for example a plurality of battery cells connected in series and having a predetermined terminal voltage (battery voltage) and predetermined design capacity. The rechargeable battery cell 1 is charged by connection to an internal power source of a not shown outside apparatus (server). By discharging the charging capacity to the above outside apparatus, it supplies the apparatus with power.

A switch device 2 comprised of a field effect transistor (FET) etc. is interposed in series in the charge current circuit of the rechargeable battery cell 1. The switch device 2 selectively closes/opens the charge current circuit by being turned on/off by a switch control circuit 7. The rechargeable battery cell 1 is controlled in charging through the switch device 2. The switch control circuit 7 is controlled in operation by the output of a charge control device which monitors the terminal voltage of the rechargeable battery cell 2 and controls its charging, that is, a $-\Delta V$ detection circuit 3.

Further, here, the explanation will be given assuming detecting the full charge state of the rechargeable battery cell 1 by $-\Delta V$ detection to control the charging of the rechargeable battery cell 1, but it is also possible to suitably employ the system of detecting the full charge state from the rate of rise of temperature of the rechargeable battery cell 1 at the time of charging for control of the charging, the system of detecting the peak voltage of the rechargeable battery cell 1 for control of the charging, and various other systems for control of charging proposed in the past.

The charge current circuit of the rechargeable battery cell 1, however, has serially interposed in it a charge/discharge measurement circuit 4 for measuring the charge current of the rechargeable battery cell 1—one of the parameters for evaluating the battery performance of the rechargeable battery cell 1. Further, between the two terminals of the rechargeable battery cell 1 is provided a battery voltage measurement circuit 5 for measuring the terminal voltage of the rechargeable battery cell 1—another parameter for evaluating the battery performance of the rechargeable battery cell 1. Further, in the figure, reference numeral 6 is a temperature sensor for monitoring the battery temperature of the rechargeable battery cell 1. This is adhered etc. to the outside of the rechargeable battery cell 1.

Figure 2:
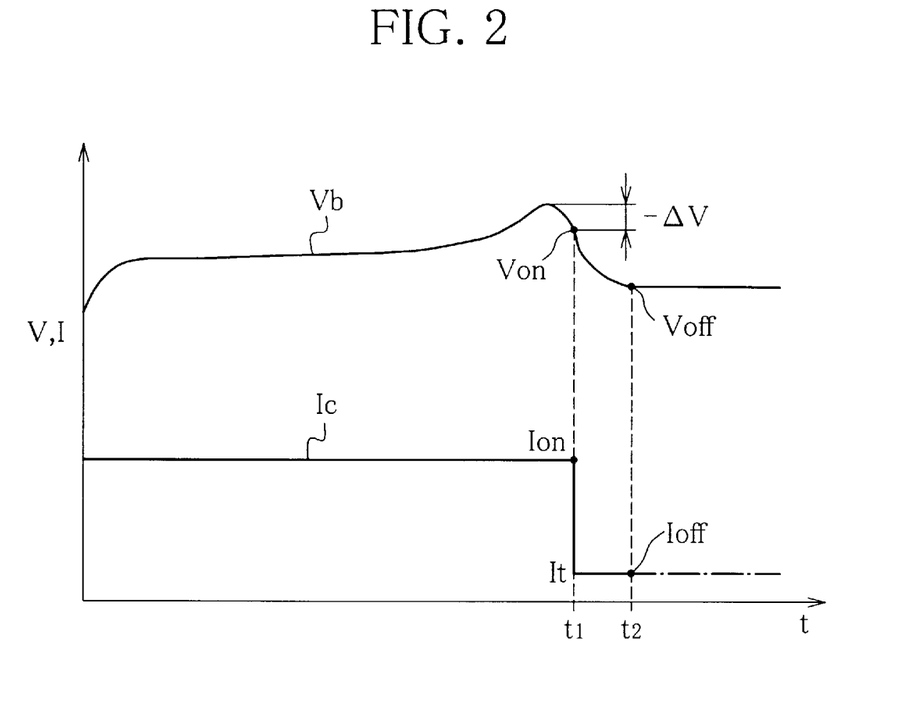
FIG. 2 is a view of timing of control for stopping charging of the rechargeable battery cell and changes in the battery voltage and current.

Further, the charging is controlled by the $-\Delta V$ detection circuit 3 in the following way. For example, as shown in FIG. 2 showing the change in the battery voltage Vb at the time of constant current charging (and the charge current Ic, the battery voltage Vb of the rechargeable battery cell 1 is substantially constant during the charge period, but rises as the full charge state is approached. When the full charge state is reached, the battery voltage Vb peaks, then falls. The $-\Delta V$ detection circuit 3 detects the time when the battery voltage Vb falls by exactly a predetermined voltage ($\Delta V$) after the peak voltage is reached as the rechargeable battery cell 1 reaching the full charge state. When the full charge state is detected, the switch device 2 is turned off to open the charge current circuit of the rechargeable battery cell 1.

This being so, the rechargeable battery cell 1 stopped being charged settles down to a constant state and the terminal voltage stabilizes after the elapse of a predetermined time from when the terminals are opened. At this time, a predetermined trickle current It derived from the constant current charging flows in the rechargeable battery cell 1. Whatever the case, the battery voltage Vb when the state of the rechargeable battery cell 1 stabilizes after the switch device 2 is opened and the charging of the rechargeable battery cell 1 is stopped is the open battery voltage Voff.

In the rechargeable battery pack controlling the charging of the rechargeable battery cell 1 as explained above, the characterizing feature of the present invention lies in the provision of a memory 11 for storing the closed circuit voltage Von of the rechargeable battery cell 1 immediately before the charging is stopped when detecting the full charge state of the rechargeable battery cell 1 to turn off the switch device 2 and open the charge current circuit of the rechargeable battery cell 1. The memory 11 operates under the control of the $-\Delta V$ detection circuit 3 and stores the closed circuit voltage Von of the rechargeable battery cell 1 detected by the battery voltage measurement circuit 5 immediately before the switch device 2 is turned off. The control output of the −ΔV detection circuit 3 is given to the timer circuit 12. The timer circuit 12 drives a second memory 13 provided in parallel with the memory 11 when a predetermined time elapses from the time when the switch device 2 is turned off (time when stopping charging of rechargeable battery cell 1). The second memory 13 stores the battery voltage Vb of the rechargeable battery cell 1 which the battery voltage measurement circuit 5 detects at the timing driven by the timer circuit 12. Therefore, the second memory 13 stores the open circuit voltage Voff at the time of elapse of a predetermined time after stopping the charging of the rechargeable battery cell 1.

The internal resistance detection circuit 14 fetching the voltages Von and Voff stored in the two memories 11 and 13 finds the value Rin corresponding to the internal resistance of the rechargeable battery cell 1 as for example $$Rin = A(Von - Voff)$$

from the open circuit voltage Von of immediately before the rechargeable battery cell 1 stops being charged and the closed circuit voltage Voff of after the charging is stopped. Here, "A" is a proportional coefficient.

Figure 3:
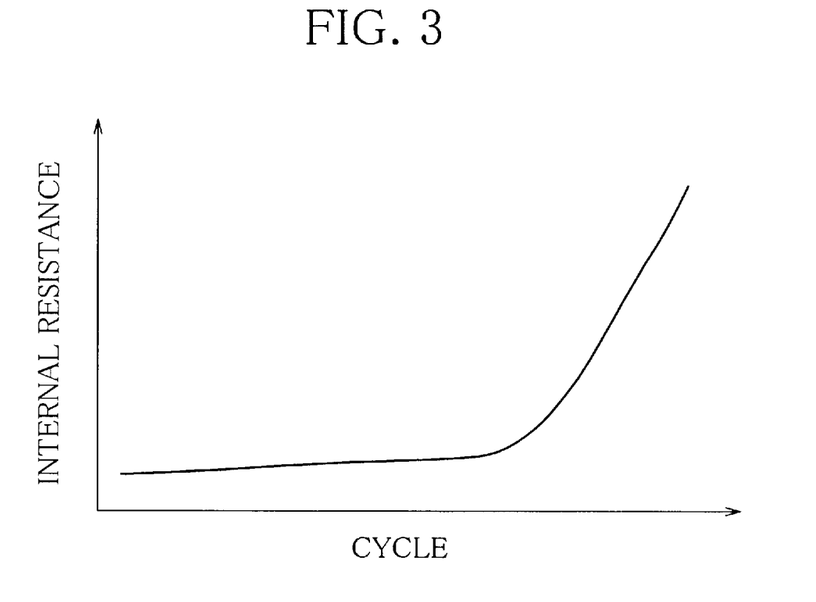
FIG. 3 is a view of the general relationship between the internal resistance and battery lifetime of a rechargeable battery cell.

The value Rin corresponding to the internal resistance is converted to information L of the battery lifetime through a battery lifetime table 15 describing the relationship between the internal resistance Rin of the rechargeable battery cell and the battery lifetime such as shown in FIG. 3. The information L of the battery lifetime is output and indicated (displayed) at the above-mentioned external device. Note that the above battery lifetime table 15 stands on the fact that the internal resistance of the rechargeable battery cell 1 has a. close correspondence with the battery lifetime as shown in FIG. 3 and stores the correspondence between the value Rin corresponding to the internal resistance and the battery lifetime in a tabular format. Therefore, by using such a battery lifetime table 15, the information L of the battery lifetime of the rechargeable battery cell 1 is found from the value Rin corresponding to the internal resistance of the rechargeable battery cell 1 calculated in the above way.

Figure 4:
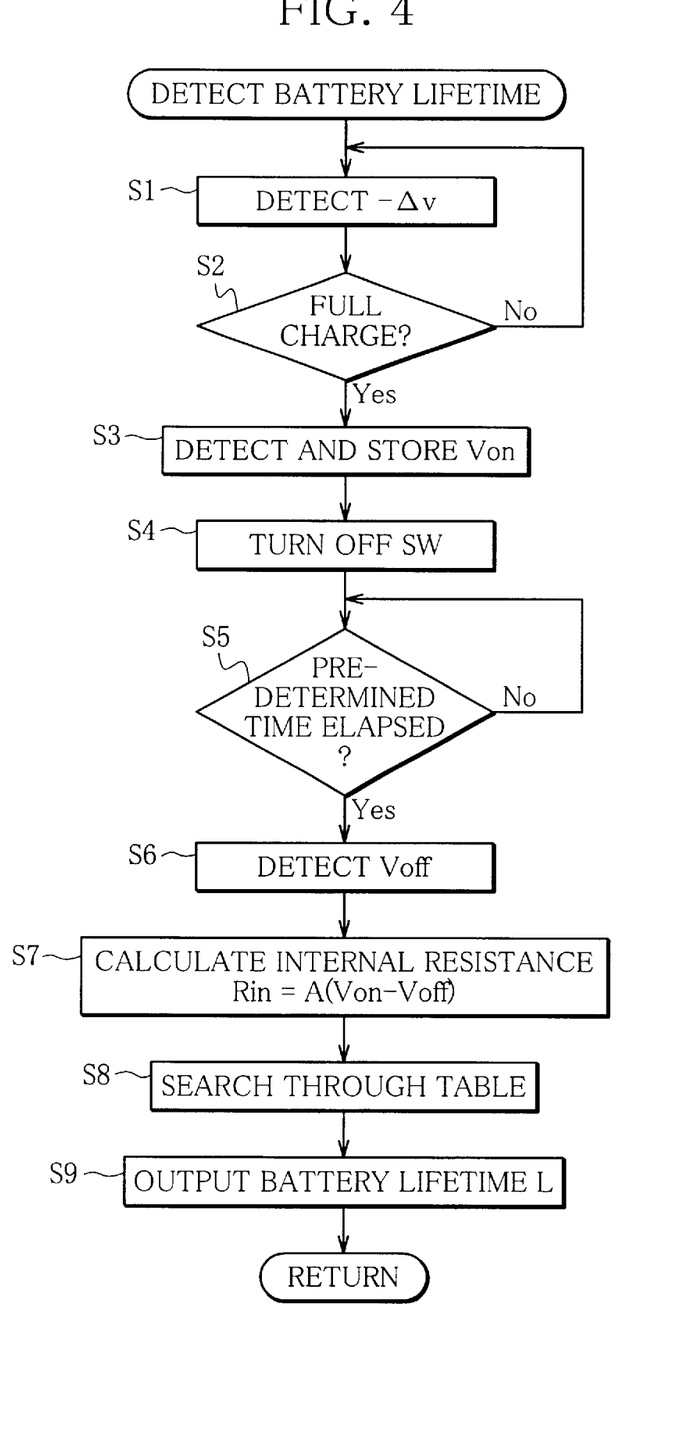
FIG. 4 is a view of the overall flow of an operation for detecting the battery lifetime in the rechargeable battery pack shown in FIG. 1.

That is, the rechargeable battery pack, as shown by the flow of the control routine in FIG. 4, detects the voltage drop (−ΔV) after the detection of the peak voltage when charging the rechargeable battery cell 1 (step S1) and judges when the rechargeable battery cell 1 reaches the full charge state (step S2). When the full charge state is detected, it detects the terminal voltage Von of the rechargeable battery cell 1, stores it in the memory 11 (step S3), then opens the switch device 2 to stop the charging of the rechargeable battery cell 1 (step S4).

Next, it uses the timer circuit 12 to judge the elapse of the predetermined time (step S5) and detects the open terminal voltage Voff at the time when the state of the rechargeable battery cell 1 after a predetermined time, that is, when the state of the rechargeable battery cell 1, stabilizes after the charging is stopped (step S6). It then calculates the value Rin corresponding to the internal resistance of the rechargeable battery cell 1 from the open terminal voltage Voff and the charge voltage Von of the rechargeable battery cell 1 immediately before the charging is stopped stored in the memory 11 (step S7), searches through the battery lifetime table 15 in accordance with this value Rin to find the information L of the lifetime of the rechargeable battery cell 1 (step S8), then outputs the lifetime information L (step S9).

Therefore, according to the rechargeable battery pack of the above configuration, when stopping the charging when the rechargeable battery cell 1 reaches the full charge state when charging the rechargeable battery cell 1, the value Rin corresponding to the rechargeable battery cell 1 after the charging is stopped is found in accordance with the closed circuit voltage Von immediately before the charging is stopped and the open circuit voltage Voff in the state where the rechargeable battery cell 1 stabilizes after the charging is stopped, so it is possible to accurately judge the battery performance of the rechargeable battery cell 1 and in turn the battery lifetime. In particular, at the timings of detection of the battery voltages Von and Voff, since the battery is in a stable state where the charging of the rechargeable battery cell 1 reaching the full charge state is stopped, it becomes possible to evaluate (judge) the battery lifetime accurately under uniform measurement conditions. Further, since there is no need to discharge the rechargeable battery cell 1 by a constant current as in the past, there are the effects that there is no economic waste and the hardware configuration can be simplified and reduced in price.

In the above embodiment, the value Rin corresponding to the internal resistance of the rechargeable battery cell 1 was found based on the closed circuit voltage Von immediately before stopping the charging at the time of detection of the full charge state and the open circuit voltage Voff when a predetermined time elapsed from when charging was stopped, but it is also possible to detect the charge current Ib of the rechargeable battery cell 1 at these detection timings. Specifically, as shown by the flow of processing in FIG. 5, the closed circuit voltage Von is detected (step S3) and the charge current Ion is detected (step S3a) immediately before stopping the charging when detecting the full charge state of the rechargeable battery cell 1. Further, when a predetermined time elapses from when the charging was stopped, the open circuit voltage Voff of the rechargeable battery cell 1 is detected (step S6) and the charge current (trickle current) Ioff is detected (step S6a). Further, the internal resistance detection circuit 14 finds the value Rin corresponding to the internal resistance of the rechargeable battery cell 1 by for example $$Rin = B(Von - Voff)/(Ion - Ioff)$$

Figure 5:
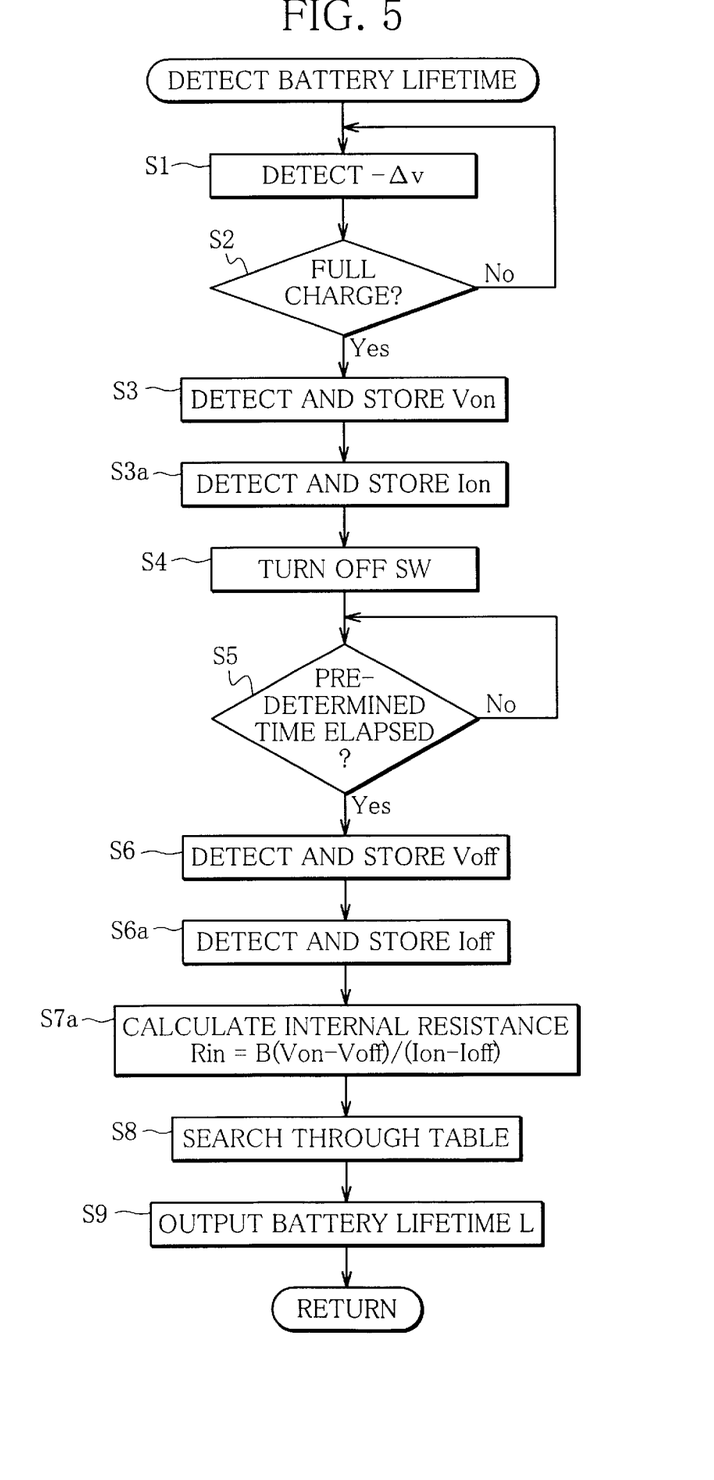
FIG. 5 is a view of the overall flow according to another embodiment of an operation for detecting the battery lifetime in the rechargeable battery pack shown in FIG. 1.

(step S7a). "B" is a proportional coefficient. By detecting the currents Ion and Ioff flowing through the rechargeable battery cell 1 in addition to the battery voltages Von and Voff of the rechargeable battery cell 1 in this way to find the value Rin corresponding to the internal resistance, it becomes possible to evaluate (judge) the battery performance and in turn the battery lifetime more accurately without regard as to the type of charging of the rechargeable battery cell 1.

Figure 6:
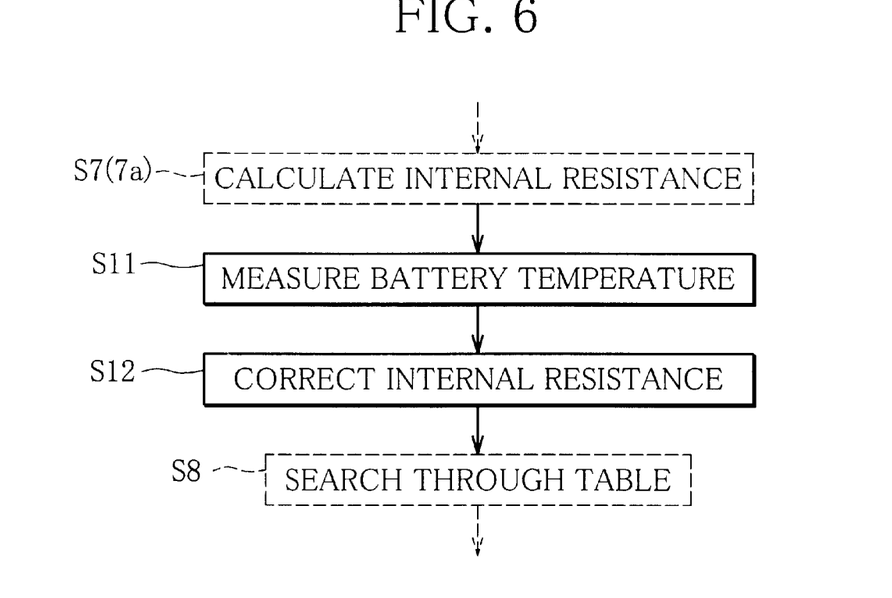
FIG. 6 is a view of processing for temperature correction for detection of internal resistance.

Further, by making temperature corrections to the battery characteristics in accordance with the battery temperature T detected by the temperature sensor 6, it becomes possible to further improve the measurement accuracy. In this case, as shown by part of the processing routine in FIG. 6, it is possible to measure the battery temperature when the charging of the rechargeable battery cell 1 is stopped (step S11) and make temperature corrections to the value Rin corresponding to the internal resistance of the rechargeable battery cell 1 found as explained above in accordance with the battery temperature measured (step S12). Next, it is also sufficient to search through the battery lifetime table 15 in accordance with the temperature corrected internal resistance.

Figure 7:
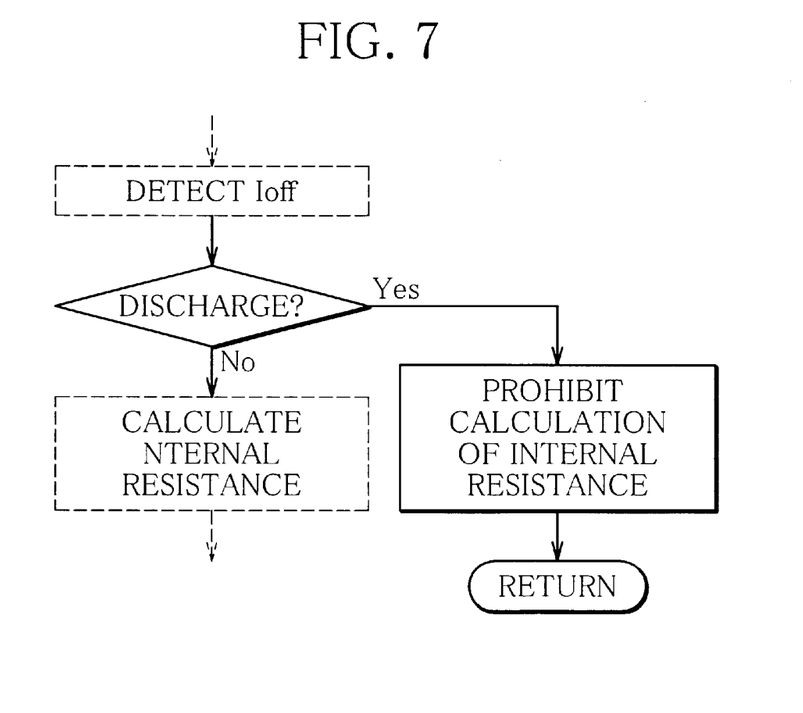
FIG. 7 is a view of an example of control for prohibiting an internal resistance detection operation.

More preferably, it is possible to monitor the discharge of the rechargeable battery cell 1 from the polarity of the current flowing through the rechargeable battery cell 1 by a discharge detection circuit 16 and prohibit the storage of the open circuit voltage Voff in the second memory 13 and prohibit. the operation of the internal resistance detection circuit 14 when detecting discharge. That is, as shown by part of the processing routine in FIG. 7, it is judged if the rechargeable battery cell 1 is discharging from the polarity of the current flowing through the rechargeable battery cell 1 (step S13). When the rechargeable battery cell 1 is discharging, the processing for calculating the internal resistance is prohibited (step S14) and the processing for estimating the battery lifetime is stopped. By providing this function for prohibiting the judgement of the battery lifetime in this way, it is possible to block the judgement (evaluation) of the processing for calculating the internal resistance and in turn the battery performance (battery lifetime) based on mistaken measurement data, so it is possible to easily improve the reliability of the judgement of the battery lifetime.

The present invention is not limited to the above embodiment. For example, it is also possible to repeatedly perform the processing for detection of the battery voltages Von and Voff as explained above when detecting the full charge state of the rechargeable battery cell 1 and evaluate the battery lifetime by making an overall judgement of the results of the processing. That is, the full charge state of the rechargeable battery cell 1 is detected, then the switch device 2 is turned on and off several times at a predetermined period to repeatedly stop the charging of the rechargeable battery cell 1. It is also possible to successively detect the battery voltages Von and Voff at that time and find the value Rin corresponding to the internal resistance of the rechargeable battery cell 1 in accordance with the mean values of the battery voltages Von and Voff. In this case, it is preferable to eliminate detected values with large deviations to keep down the fluctuations in detection of the battery voltages Von and Voff and improve the accuracy of measurement.

Further, it is possible not to provide the second memory 13 and to perform the processing for calculating the internal resistance by obtaining the open circuit voltage Voff from the battery voltage measurement circuit 5 in the internal resistance detection circuit 14. Further, here, the explanation was made of the case of use of a nickel-metal halide battery as the rechargeable battery cell 1, but of course the invention can also be applied to the use of a Li ion battery or other rechargeable battery cell. Further, it is possible to turn the switch device 2 on and off to evaluate the battery performance (battery lifetime) in the end charge state before the rechargeable battery cell 1 reaches the full charge state. Further, it is of course possible to control the processing for detection of the battery voltages Von and Voff by software. The present invention can be modified in various other ways as well within the scope of the invention.

As explained above, according to the present invention, since the battery performance is evaluated based on the closed circuit voltage immediately before control for stopping charging when charging the rechargeable battery cell and the open circuit voltage after stopping charging, it becomes possible to accurately evaluate (judge) the battery lifetime accurately under a stable state of the battery and uniform measurement conditions. Further, there is no need to discharge the rechargeable battery cell by a constant current. Since the lifetime is evaluated under a stable state of the battery at all times, the battery lifetime can be easily and accurately judged. Further, there are the tremendously practical effects of simplification of the configuration and reduction of the price of the rechargeable battery pack as a whole.

While the invention has been described with reference to specific embodiment chosen for purpose of illustration, it should be apparent that numerous modifications could be made thereto by those skilled in the art without departing from the basic concept and scope of the invention.

The present disclosure relates to subject matter contained in Japanese Patent Application No. 2000-19566, filed on Jun. 29, 2000, the disclosure of which is expressly incorporated herein by reference in its entirety.

What is claimed is:

1. A rechargeable battery pack comprising:

at least one rechargeable battery cell, a battery voltage detecting means for detecting a terminal voltage of said rechargeable battery cell, a fall charge detecting means for detecting a full charge state of said rechargeable battery cell when a predetermined parameter reaches a value indicating achievement of the fall charge state of said rechargeable battery cell while said rechargeable battery cell is charged, a switch device interposed in a charge current circuit of said rechargeable battery cell and turned off to open said charge current circuit when said full charge detecting means detects a full charge state, a memory for storing a closed circuit voltage Von of said rechargeable battery cell detected by said battery voltage detecting means immediately before said charge current circuit is opened, an internal resistance detecting means for finding a value corresponding to an internal resistance Rin of said rechargeable battery cell from an open circuit voltage Voff of said rechargeable battery cell detected by said battery voltage detecting means and the closed circuit voltage Von stored in said memory after said charge current circuit is opened, and a lifetime indicating means for predicting the lifetime of said rechargeable battery cell in accordance with the value corresponding to the internal resistance of said rechargeable battery cell and outputting information on the lifetime.

2. A rechargeable battery pack comprising:

at least one rechargeable battery cell, a battery voltage detecting means for detecting a terminal voltage of said rechargeable battery cell, a current detecting means for detecting a charge/discharge current with respect to said rechargeable battery cell, a full charge detecting means for detecting a full charge state of said rechargeable battery cell when a predetermined parameter reaches a value indicating achievement of the full charge state of said rechargeable battery cell while said rechargeable battery cell is charged, a switch device interposed in a charge current circuit of said rechargeable battery cell and turned off to open said charge current circuit when said fall charge detecting means detects a fall charge state, a memory for storing a closed circuit voltage Von of said rechargeable battery cell detected by said battery voltage detecting means and a battery charge current Ion detected by said current detecting means immediately before said charge current circuit is opened, an internal resistance detecting means for finding a value corresponding to an internal resistance Rin of said rechargeable battery cell from an open circuit voltage Voff of said rechargeable battery cell detected by said battery voltage detecting means and a current Ioff detected by said current detecting means after said charge current circuit is opened and the closed circuit voltage Von and battery charge current Ion stored in said memory, and a lifetime indicating means for predicting the lifetime of said rechargeable battery cell in accordance with the value corresponding to the internal resistance of said rechargeable battery cell and outputting information on the lifetime.

3. A rechargeable battery pack as set forth in claim 1 or 2, wherein:

said internal resistance detecting means includes timer means for measuring a time elapsed from the time of detecting the full charge state of the rechargeable battery cell;

said internal resistance detecting means finds an open circuit voltage Voff of said rechargeable battery cell when a predetermined elapsed time from the time of detecting the full charge state of the rechargeable battery cell is measured by said timer means.

4. A rechargeable battery pack as set forth in claim 1 or 2, further comprising:

means for prohibiting the internal resistance detecting means from calculating the internal resistance of the rechargeable battery cell when a discharge current of said rechargeable battery cell is detected by said current detecting means.

5. A rechargeable battery pack as set forth in claim 1 or 2, further comprising:

battery temperature detecting means for detecting a temperature of said rechargeable battery cell; and correcting means for correcting the value corresponding to the internal resistance of the rechargeable battery cell found by said internal resistance detecting means in accordance with the battery temperature detected by said battery temperature detecting means.

6. A rechargeable battery pack as set forth in claim 1 or 2, further comprising:

switch control means for operating said switch device to repeatedly close and open a charge current circuit for said rechargeable battery cell, wherein said internal resistance detecting means detects the states of the rechargeable battery cell immediately before the charge current circuit is opened and after the charge current circuit is opened to evaluate the lifetime of the rechargeable battery cell.

7. A rechargeable battery pack as set forth in claim 1 or 2, wherein the rechargeable battery cell includes:

a nickel-metal hydride (Ni-MH) type cell.

8. A rechargeable battery pack as set forth in claim 1 or 2, wherein:

said full charge detecting means includes means for detecting the full charge state when a battery voltage, serving as the predetermined parameter of the rechargeable battery cell, assumes its pak voltage.

9. A rechargeable battery pack as set forth in claim 1 or 2, wherein:

said full charge detecting means includes means for detecting the full charge state when a battery voltage, serving as the predetermined parameter of the rechargeable battery cell, falls by a predetermined voltage from its peak voltage after the peak voltage is reached.

10. A rechargeable battery pack as set forth in claim 1 or 2, wherein:

said full charge detecting means includes means for detecting the full charge state based on a rate of rise of temperature of the rechargeable battery cell, the rate of rise of temperature serving as the predetermined parameter.

* * * * *